(12) United States Patent
Kang et al.

(10) Patent No.: US 6,396,756 B1
(45) Date of Patent: May 28, 2002

(54) INTEGRATED CIRCUIT MEMORY DEVICES INCLUDING TRANSMISSION PARTS THAT ARE ADJACENT INPUT/OUTPUT SELECTION PARTS

(75) Inventors: Sang-Seok Kang; Jae-Hoon Joo; Young-Ok Cho, all of Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/684,190

(22) Filed: Oct. 6, 2000

(30) Foreign Application Priority Data

Oct. 8, 1999  (KR) ............................................. 99-43366

(51) Int. Cl.$^7$ ................................................. G11C 7/00
(52) U.S. Cl. ......................................... 365/205; 365/63
(58) Field of Search .................................... 365/205, 63

(56) References Cited

U.S. PATENT DOCUMENTS

| 5,272,665 A | | 12/1993 | Uesugi ......................... 365/63 |
| 6,028,797 A | * | 2/2000 | Kim et al. ................... 365/190 |
| 6,046,950 A | * | 4/2000 | Kim ............................ 365/205 |
| 6,069,812 A | | 5/2000 | Lee et al. .................... 365/51 |
| 6,094,382 A | | 7/2000 | Choi et al. .................. 365/200 |

OTHER PUBLICATIONS

U.S. application No. 09/280,026 Yoo, filed Mar. 25, 1999.
U.S. application No. 09/466,536, Moon, filed Dec. 17, 1999.
U.S. application No. 09/614,987, Moon et al., filed Jul. 12, 2000.

* cited by examiner

*Primary Examiner*—M. Tran
(74) *Attorney, Agent, or Firm*—Myers Bigel Sibley & Sajovec

(57) ABSTRACT

Integrated circuit memory devices include first and second memory cell arrays, first and second transmission parts between the first and second memory cell arrays, and first and second input/output selection parts between the first and second memory cell arrays, wherein the first transmission part is adjacent the first input/output selection part and wherein the second transmission part is adjacent the second input/output selection part. A transistor in the first transmission part and a transistor in the first input/output selection part can share a first common source/drain region. A transistor in the second transmission part and a transistor in the second input/output selection part also can share a second common source/drain region. First and second input/output selection parts also may be provided between the first and second transmission parts. At least one sense amplifier part may be provided between the first and second input/output selection parts.

16 Claims, 4 Drawing Sheets

INTEGRATED CIRCUIT MEMORY DEVICES INCLUDING TRANSMISSION PARTS THAT ARE ADJACENT INPUT/OUTPUT SELECTION PARTS

FIELD OF THE INVENTION

This invention relates to integrated circuit devices, and more particularly to integrated circuit memory devices.

BACKGROUND OF THE INVENTION

Integrated circuit memory devices are widely used in consumer and commercial applications. As the integration density of integrated circuit memory devices continues to increase, it may become increasingly important to improve the layout efficiency of the integrated circuit memory device. In particular, it may be increasingly important to improve the arrangement of functional blocks, also referred to herein as parts, of the integrated circuit device, relative to one another, on an integrated circuit substrate.

FIG. 1 is a circuit diagram of an integrated circuit memory device such as a conventional Dynamic Random Access Memory (DRAM). As shown in FIG. 1, an input/output (I/O) selecting part 30 is positioned between a pair of first and second sense amplifying parts 10, 20 for bit line pairs BL1, /BL1, and another input/output selecting part 30a is between another pair of first and second sense amplifying parts for BL2, /BL2.

A first transmission part 40 is arranged on the left side of the first sense amplifying part 10 of the bit line BL1, /BL1, BL2, /BL2 to control selection of the memory cell array part 60, and a first voltage equalizing part 50 is arranged on the left side of the first sense amplifying part 10 to control turning on/off of the first memory cell array part 60 of the bit line pairs BL1, /BL1, BL2, /BL2. Furthermore, a first memory cell array part is arranged on the left side of the first voltage equalizing part.

Likewise, a second transmission part 70 is arranged on the right side of the second sense amplifying part 20, and a first voltage equalizing part 80 is arranged on the right side of the second transmission part 70 to control turning on/off of each pair of bit lines BL1, /BL1, BL2, /BL2. Furthermore, a second memory cell array part 90 is arranged on the right side of the second voltage equalizing part 80.

In addition, the pairs of bit lines BL1, /BL1, BL2, /BL2 are respectively extended in the horizontal directions from the first memory cell array part 60 across the first transmission part 40 to the first sense amplifying part 10 and from the first sense amplifying part 10 across the second transmission part 70 to the second memory cell array part 90. Word lines (not shown) also vertically extend across the first and second memory cell arrays 60, 90. The first and second sense amplifying parts 10, 20 amplify by detecting a difference in voltage between pairs of bit lines associated with the memory cell array parts 60, 90. The input/output selection part 30 selectively outputs the voltage amplified by the first and second sense amplifying parts 10, 20 to the input/output lines IO1, IO2, /IO1, /IO2.

The operations of each of the parts that were described above are well known to those having skill in the art, and need not be described in detail herein. Moreover, it will be understood that all of the parts generally may be duplicated, in the vertical direction, for additional bit line pairs BL3, /BL3, BL4, /BL4 . . . , to form an integrated circuit memory device.

In the memory cell array parts 60, 90, memory cells (not shown) are arranged at the crossing points of the word lines (not shown) and bit lines. The voltage equalizing parts 50, 80 may be constructed with conventional circuits, and need not be described in detail.

In the transmission part 40, transistors Q4, Q5 are respectively connected to the bit lines BL1, /BL1, and signal PISOL is commonly transmitted to gates of the transistors Q4, Q5. Similarly, in the transmission part 70, transistors Q14, Q15 are respectively connected to the bit lines BL1, /BL1, and signal PISOR is commonly transmitted to gates of the transistors Q14, Q15.

In the sense amplifying part 10, the drain and gate of NMOS transistor Q6 are respectively connected to bit lines BL1, /BL1, and the drain and gate of NMOS transistor Q7 are respectively connected to bit lines BL1, /BL1. The sources S of the transistors Q6, Q7 are connected together. Likewise, in the sense amplifying part 20, the drain and gate of PMOS transistor Q16 are respectively connected to bit lines BL1, /BL1, and the drain and gate of PMOS transistor Q17 are respectively connected to bit lines BL1, /BL1. The sources S of the transistors Q16, Q17 are connected together. A predetermined power supply voltage Vss is supplied to the sources S of the transistors Q6, Q7 during the operations of the sense amplifying part 10, while another power supply voltage Vcc is supplied to the sources S of the transistors Q16, Q17 during the operations of the sense amplifying part 20.

In the input/output selection part 30, the drain D and source S of transistor Q8 are respectively connected to a bit line BL1 and an input/output line IO1, while the drain D and source S of transistor Q9 are respectively connected to bit line /BL1 and input/output line /IO1.

Similarly, in the input/output selection part 30a, the drain D and source S of transistor Q18 are respectively connected to a bit line BL2 and an input/output line IO2, while the drain D and source S of transistor Q19 are respectively connected to a bit line /BL2 and an input/output line /IO2. Signal IOG is commonly supplied to the gates of transistors Q8, Q9, Q18, Q19.

The layout view of the circuit thus constructed is shown in FIG. 2. As shown in FIG. 2, only the arrangement of the aforementioned parts relevant to the pairs of bit lines BL1, /BL1, BL2, /BL2 is described. It will be understood that parts relevant to all other pairs of bit lines BL3, /BL3, BL4, /BL4 . . . also may be arranged identical to those of the pairs of bit lines BL1, /BL1, BL2, /BL2. The detailed layout of the memory cell array parts 60, 90 also are not shown.

In FIG. 2, the regions filled with dots indicate an N+ active region 100 for NMOS transistors Q6, Q7 of a sense amplifying part 10, N+ active regions 311, 312 for NMOS transistors Q8, Q9 of an input/output selection part 30, N+ active regions 311, 312 for NMOS transistors Q18, Q19 of an input/output selection part 30a, N+ active regions 400, 700 for NMOS transistors Q4, Q5, Q14, Q15 of the transmission parts 40, 70, and N+ active regions 500, 800 for NMOS transistors Q1, Q2, Q3, Q11, Q12, Q13 of voltage equalizing parts 50, 80.

The P+ active region 200 for PMOS transistors Q16, Q17 of the sense amplifying part 20 and the P+ active regions 110, 210 for supplying substrate voltage $V_{BB}$ are designated by regions filled with triangular points.

The signal lines 510, 810, 410, 710 and gates 120, 130, 220, 230, 320, 330 to respectively transmit signals PEQL, PEQR, PISOL, PISOR may comprise polysilicon layers and designated by regions filled with slanted lines. The pairs of bit lines BL1, /BL1, BL2, /BL2 also may comprise polysilicon layers, being indicated by dotted lines. The input/ output lines IO1, IO2, /IO1, /IO2 may be formed in metal layers, being designated by a solid line. The power lines 140, 240 of the sense amplifying parts 10, 20 may be formed in metal layers, being designated by a solid line.

The N+ and P+ active regions 100, 200 are positioned at both left and right sides of N+ active regions 311,312 for transistors Q8, Q9, Q18, Q19 of an input/output selection part 30. A P+ active region 200 is arranged in N well 201. The P+ active region 110 is vertically extended and arranged at the left side of the N+ active region 100. The P+ active region 210 is also vertically extended and arranged at the right side of the N well 201. The N+ active region 400 is horizontally extended and integrally connected from a predetermined right portion of the N+ active region 500. The N+ active region 700 is horizontally extended and integrally connected from a predetermined left portion of the N+ active region 500.

The signal line 510 is vertically extended along a channel area between the N+ active regions 500 for transistors Q1, Q2 of each pair of bit lines, and, in addition, horizontally extended along a channel area between the N+ active regions 500 for transistor Q3. Likewise, the signal line 810 is vertically extended along a channel region between the N+ active regions 800 for transistors Q11, Q12 of each pair of bit lines, and, in addition, horizontally extended along a channel area between the N+ active regions 800 for transistor Q13.

The signal line 410 is vertically extended along a channel area between the N+ active regions 400 for transistors Q4, Q5 of each pair of bit lines. Likewise, the signal line 710 is vertically extended along a channel region between the N+ active regions 700 for transistors Q14, Q15 of each pair of bit lines.

Gates 130, 120 are extended along a channel area between N+ regions 100 for the transistors Q7, Q6 of each pair of bit lines. The gates 230, 220 are also extended along a channel area between P+ active regions 200 for transistors Q17, Q16 of each pair of bit lines. A gate 320 is extended from the channel area of a N+ active region 311 toward that for transistor Q8. A gate 330 is extended from the channel area of a N+ active region 311 toward that for transistor Q18.

Each pair of bit lines BL1, /BL1, BL2, /BL2 is horizontally extended from the left side of the memory cell array part 60 across the signal line 510 to the N+ active region 500 for the drain of transistors Q1, Q2 and electrically connected by contacts C1, C2 with the N+ active region 500 for the drain of transistors Q1, Q2. Similarly, each pair of bit lines BL1, /BL1, BL2, /BL2 is also horizontally extended from the right side of the memory cell array part 90 across the signal line 810 to the N+ active region 800 for the drain D of transistors Q11, Q12 and electrically connected by contacts C11, C12 with the N+ active region 800 for the drain of transistors Q11, Q12.

Also, each pair of bit lines BL1, /BL1, BL2, /BL2 is horizontally extended from the N+ active region 400 for the source of transistors Q4, Q5 across N+ active regions 100, 311, 312 and P+ active regions 200, 210 to the N+ active region 700 for the source of transistors Q14, Q15. Accordingly, the pairs of bit lines BL1, /BL1, BL2, /BL2 are electrically connected by contacts C3, C4 to the source S of transistors Q4, Q5 and by contacts C13, 14 to the source S of transistors Q14, Q15.

Also, the pairs of bit lines BL1, /BL1, BL2, /BL2 are electrically connected by contacts C5, C6 to the drain D of Q6, Q7 and by contacts C7, C8 to the gates 130, 120 outside the N+ active region 100. Likewise, the pairs of bit lines BL1, /BL1, BL2, /BL2 are horizontally extended across a predetermined part of the relevant gates 220, 230 to the P+ active region 200 for the drain D of transistors Q16, Q17, and electrically connected by contacts C15, C16 to the drain D of transistors Q16, Q17. Furthermore, the pairs of bit lines BL1, /BL1, BL2, /BL2 are also electrically connected by contacts C17, C18 to the gates 230, 220 at a predetermined part of the P+ active region 200. The pairs of bit lines BL1, /BL1, BL2, /BL2 are electrically connected, respectively by contacts C9, C10 to the drain D of transistors Q8, Q9 and that of transistors Q18, Q19. Power line 140 is vertically extended across the pairs of bit lines BL1, /BL1, BL2, /BL2 and electrically connected by a contact C19 to the N+ active region 100 for the source S of transistors Q6, Q7. Similarly, a power line 240 is vertically extended across the pairs of bit lines BL1, /BL1, BL2, /BL2 and electrically connected by a contact C20 to the P+ active region 200 for the source S of transistors Q16, Q17.

The input/output lines IO1, IO2, /IO1, /IO2 are sequentially wired from the left to the right and vertically extended across the pairs of bit lines BL1, /BL1, BL2, /BL2.

In addition, the input/output line IO1 is vertically extended across the N+ active region 311 for the transistor Q8 of a pair of bit lines BL1, /BL1, and the input/output line /IO1 is vertically extended across the N+ active region 312 for the transistor Q9 of a pair of bit lines BL1, /BL1. Similarly, the input/output line IO2 is vertically extended across the N+ active region 311 for the transistor Q18 of a pair of bit lines BL2, /BL2, and the input/output line /IO2 is vertically extended across the N+ active region 312 for the transistor Q19 of a pair of bit lines BL2, /BL2. The input/output lines IO1, IO2 are electrically connected by contact C21, C23 to the source S of transistors Q8, Q18, and the input/output lines /IO1, IO2 are electrically connected by contact C22, C24 to the source S of transistors Q9, Q19. A line to supply signal IOG to a gate 320 is not shown.

Notwithstanding the arrangement of FIGS. 1 and 2, it may continue to be desirable to further increase the integration density of an integrated circuit memory device. Moreover, it also may be desirable to allow a reduction in the number of contacts that may be needed to interconnect the transistors of the integrated circuit memory device.

SUMMARY OF THE INVENTION

Embodiments of the present invention provide integrated circuit memory devices that include first and second memory cell arrays, first and second transmission parts between the first and second memory cell arrays, and first and second input/output selection parts between the first and second memory cell arrays, wherein the first transmission part is adjacent the first input/output selection part and wherein the second transmission part is adjacent the second input/output selection part. In other embodiments, a transistor in the first transmission part and a transistor in the first input/output selection part share a first common source/drain region. A transistor in the second transmission part and a transistor in the second input/output selection part share a second common source/drain region. Accordingly, the integration density may be increased, and the number of contacts may be decreased.

Other embodiments of the invention provide the first and second input/output selection parts between the first and second transmission parts. In other embodiments, at least one sense amplifier part is provided between the first and second input/output selection parts. The at least one sense amplifier may comprise first and second sense amplifier parts.

In yet other embodiments, a first equalizing part also may be provided between the first memory cell array and the first transmission part. A second equalizing part may be provided between the second memory cell array and the second transmission part. Finally, in still other embodiments, first input/output lines are connected to the first input/output selection part. Second input/output lines are connected to the second input/output part.

DETAILED DESCRIPTION OF PREFERRED EMBODIMENTS

Figure 1:
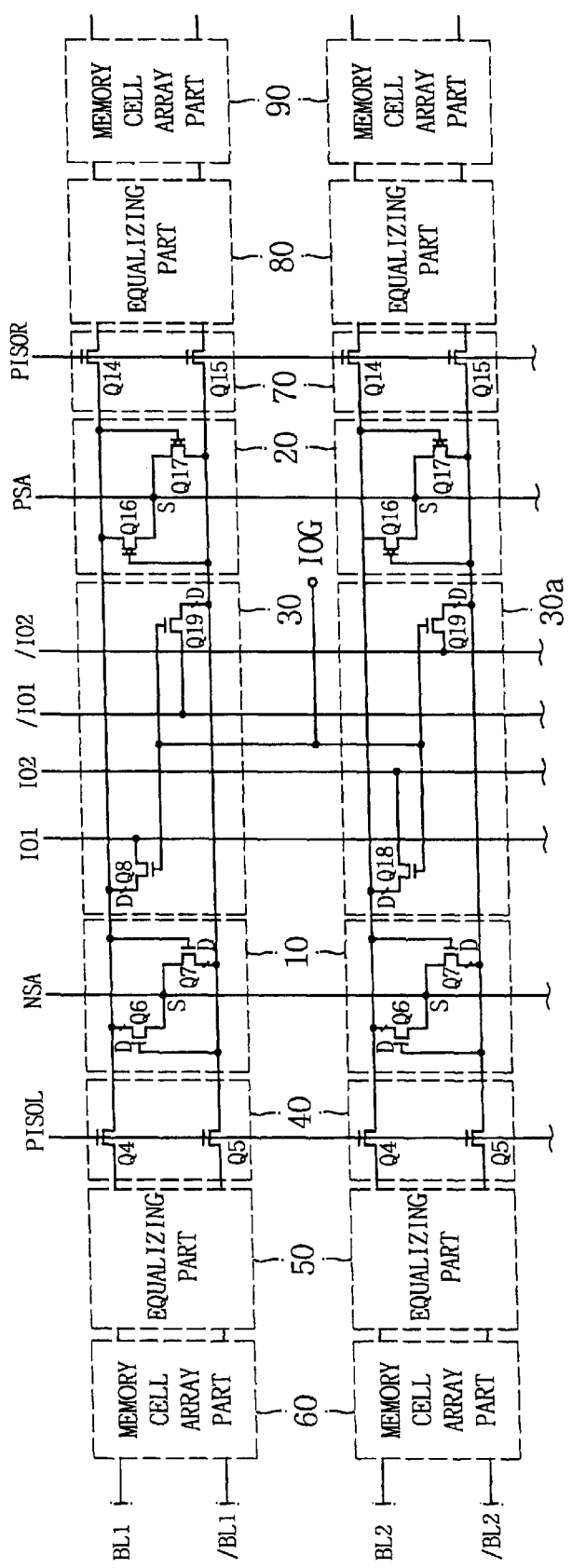
FIG. 1 is a circuit diagram of a conventional integrated circuit memory device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the relative sizes of regions may be exaggerated for clarity. Like numbers refer to like elements throughout. Each embodiment described and illustrated herein includes its complementary conductivity type embodiment as well. It also will be understood that the terms "horizontal" and "vertical" are used herein to denote different directions that preferably are orthogonal, rather than to indicate absolute directions. Moreover, the terms "left" and "right" are used to indicate opposite directions along an axis, rather than absolute directions.

Figure 3:
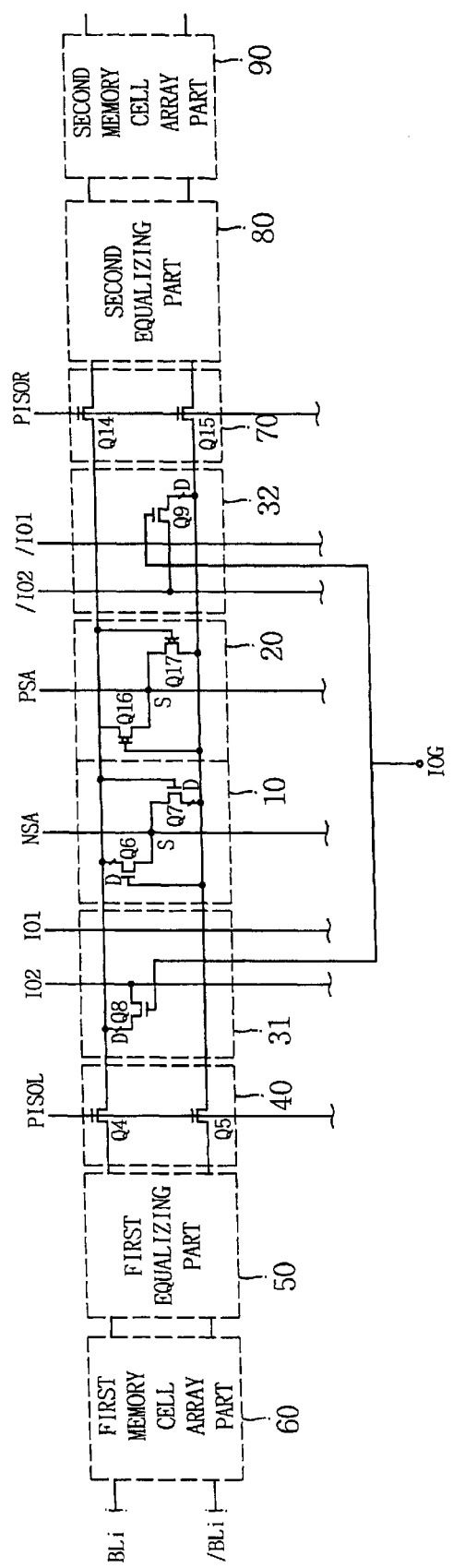
FIG. 3 is a circuit diagram of integrated circuit memory devices according to embodiments of the present invention.

FIG. 3 is a circuit diagram of integrated circuit memory devices according to embodiments of the present invention. For ease of explanation, only the arrangements of parts relevant to a pair of bit lines BLi, /BLi will be described below. However, it will be understood that many more bit line pairs, and corresponding memory parts therebetween, may be provided in integrated circuit memory devices.

As shown in FIG. 3, the first and second sense amplifying parts 10, 20 are arranged adjacent one another. The first transmission part 40, the first voltage equalizing part 50 and the first memory cell array part 60 are sequentially disposed to the left side of the first sense amplifying part 10. The second transmission part 70, the second voltage equalizing part 80 and the second memory cell part 90 are sequentially disposed to the right side of the second sense amplifying part 20.

In the pair of bit lines BLi, /BLi, the first and second input/output selection parts 31, 32 are respectively arranged between the first sense amplifying part 10 and the first transmission part 40, and the second amplifying part 20 and the second transmission part 70.

In addition, the bit lines BLi, /BLi are horizontally extended respectively from the first memory cell array part 60 across the first transmission part 40 to the first sense amplifying part 10 and from the first sense amplifying part 10 across the second transmission part 70 to the second memory cell array part 90. Word lines (not shown) are vertically extended across the first and second memory cell parts 60, 90.

Furthermore, in the first input/output selection part 31, the drain D of transistor Q5 and the source S of transistor Q4 are electrically connected, and the source of transistor Q8 is connected to the input/output line IO2. In the second input/output selection part 32, the drain D of transistor Q9 and the source S of transistor Q15 are electrically connected and commonly connected to the bit line /BLi. Also, the source S of transistor Q9 is connected to the input/output line /IO2. Likewise, In the first input/output selection part 31, the drain D of transistor Q18 and the source S of transistor Q4 are electrically connected, and commonly connected to the bit line BLi. Also, the source S of transistor Q18 is connected to the input/output line IO1. In the second input/output selection part 32, the drain D of transistor Q19 and the source S of transistor Q15 are electrically interconnected, and commonly connected to the bit line /BLi. Also, the source S of transistor Q19 is connected to the input/output line /IO1. Signal IOG is commonly supplied to the gates of transistors Q8, Q9, Q18, Q19.

In the memory cell array parts 60, 90 memory cells (not shown) are respectively arranged at a crossing point of word lines (not shown) and a pair of bit lines BLi, /BLi. The voltage equalizing parts 50, 80 may be constructed with conventional circuits and need not be described in detail herein.

In the transmission part 40, transistor Q4 is connected to a bit line BLi and transistor Q5 is connected to the other bit line /BLi. Signal PISOL is commonly supplied to the gates of transistors Q4, Q5. Similarly, in the transmission part 70, translator Q14 is connected to a bit line BLi, transistor Q15 is connected to the other bit line /BLi. Signal PISOR is commonly supplied to the gates of translators Q14, Q15.

In sense amplifying part 10, the drain D of transistor Q6 is connected to a bit line BLi, and the gate of transistor Q6 is connected to the other bit line /BLi. The drain D of transistor Q7 is connected to a bit line /BLi, and the gate of transistor Q7 is connected to the other bit line BLi. The sources S of transistors Q6, Q7 are in a common connection. Likewise, in the sense amplifying part 20, the drain D of transistor Q16 is connected to the bit line BLi, and the gate of transistor Q16 is connected to the bit line /BLi. The drain D of transistor Q17 is connected to the bit line /BLi, and the gate of transistor Q17 is connected to the bit line BLi. The sources S of transistors Q16, Q17 are in a common connection. Power supply voltage Vss is supplied to the source S of transistors Q6, Q7, while power supply voltage Vcc is supplied to the source S of transistors Q16, Q17.

Figure 4:
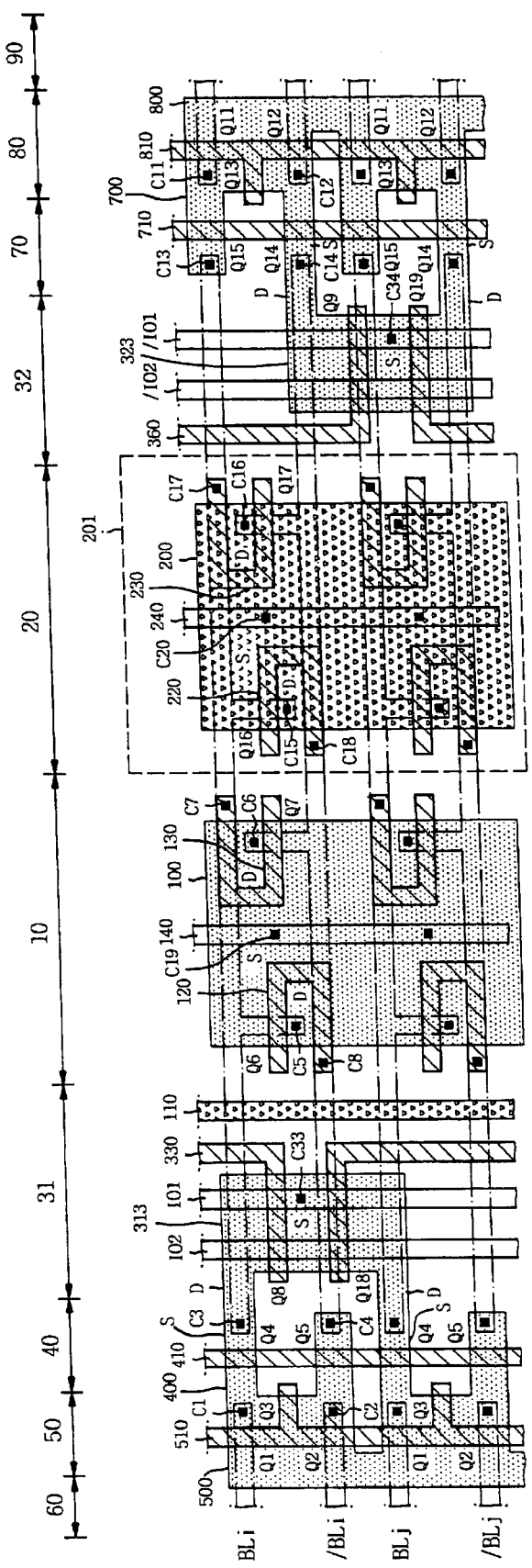
FIG. 4 is a layout diagram of integrated circuit memory devices according to embodiments of the present invention.

FIG. 4 is a layout view of integrated circuit memory devices in an integrated circuit substrate such as a silicon semiconductor substrate, according to embodiments of the present invention. It will be understood that the layout view relates to pairs of bit lines BLi, /BLi, BLj, /BLj, and may be extended for many additional pairs of bit lines in an integrated circuit memory device.

In FIG. 4, the layout view includes N+ active region 100 for NMOS transistors Q6, Q7 of the first sense amplifying part 10; N+ active region 313 for NMOS transistors Q8, Q18 of the first input/output selection part 31; N+ active region 323 for NMOS transistors Q9, Q19 of the second input/output selection part 32; N+ active regions 400, 700 for NMOS transistors (Q4, Q5), (Q14, Q15) of the first and second transmission parts 40, 70; and N+ active regions 500, 800 for NMOS transistors (Q1, Q2, Q3), (Q11, Q12, Q13)

of the first and second voltage equalizing parts 50, 80. All of these parts are designated by regions filled with dots. The P+ active region 200 for PMOS transistors Q16, Q17 of the second sense amplifying part 20 and the P+ active region 110 for supplying reference voltage VBB are indicated by regions filled with triangular points. Signal lines 510, 810, 410, 710 for respectively supplying signals PEQL, PEQR, PISOL, PISOR and gates 120, 130, 220, 230, 350, 360 are designated by regions filled with slanted lines. Pairs of bit lines BLi, /BLi, BLj, /BLj are indicated by dotted lines. The input/output lines IO1, /IO1, IO2, /IO2 and power lines 140, 240 of the sense amplifying parts 10, 20 are indicated by solid lines.

N+ active region 100 and P+ active region 200 are arranged adjacent one another. P+ active region 200 is arranged in N well 201. The P+ active region 110 is vertically extended and arranged to the left side of the N+ active region 100. The N+ active region 500 is arranged to the right side of the memory cell array part 60, and N+ active region 400 is arranged to the right side of the N+ active region 500. The N+ active region 800 is arranged to the left side of the memory cell array part 90, and the N+ active region 700 is arranged to the left side of the N+ active region 800.

The N+ active region 313 for the input selection part 31 is positioned between the N+ active region 400 and the P+ active region 100, and the N+ active region 323 for the input selection part 32 is positioned between the N+ active region 700 and the P+ active region 200. The active region 313 for the drain D of transistor Q8 is integrated with the N+ active region 400 for the source S of transistor Q4 of the transmission part 40, and the N+ active region 323 for the drain D of transistor Q9 is integrated with the N+ active region 700 for the source S of transistor Q14 of the transmission part 70. In other words, the drain D of transistors Q8, Q9 and the source S of transistors Q4, Q14 share common source/drain regions.

Figure 2:
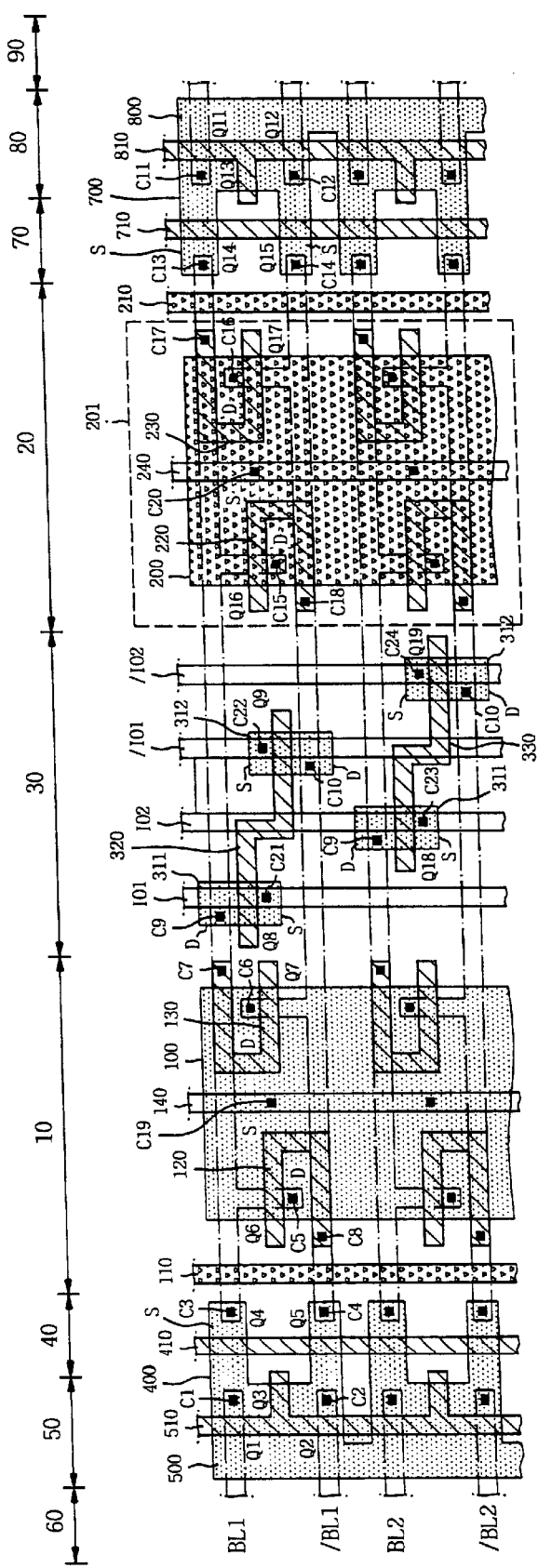
FIG. 2 is a layout diagram of an integrated circuit memory device of FIG. 1.

Therefore, in comparison with the separate arrangement for the drains D of transistor Q8, Q9 and the sources S of transistors Q4, Q14 in FIGS. 1 and 2, embodiments of the present invention can reduce the area for these transistors, and, therefore, can reduce the size of the integrated circuit memory device. In addition, in comparison with the drains D of transistors Q8, Q9 and the sources S of transistors Q4, Q14 which are electrically connected, respectively, by two separate contacts, a common contact may be used, respectively, for an electrical connection with associated bit lines in embodiments of the present invention, thereby allowing the number of contacts for each bit line to be reduced. Likewise, the drain D of transistors Q18, Q19 and the source S of transistors Q4, Q14 are shared in the pairs of bit lines BLi, /BLi, so as to allow the same effect.

Signal line 510 is vertically extended along the channel area between the N+ active region 500 for transistors Q1, Q2 of respective pair of bit lines and horizontally extended along the channel area between the N+ active region 500 for transistor Q3. Similarly, signal line 810 is vertically extended along the channel area between the N+ active region 800 for transistors Q11, Q12 of respective pair of bit lines and horizontally extended along the channel area between the N+ active region 800 for transistor Q13.

Signal line 410 is vertically extended along the channel area between the N+ active region 400 for transistors Q4, Q5 of respective pair of bit lines, and signal line 710 is vertically extended along the channel area between the N+ active region 700 for transistors Q14, Q15 of respective pair of bit lines.

Gates 130, 120 are extended the channel area between the N+ active region 100 for transistors Q7, Q6, and gates 230, 220 are extended the channel area between the P+ active region 200 for transistors Q17, Q16. Gate 350 is extended the channel area between the N+ active region 313 for transistors Q8, Q18, and gate 360 is extended the channel area between the N+ active region 323 for transistors Q9, Q19.

Each pair of bit lines BLi, /BLi, BLj, /BLj is horizontally extended from the memory array part 60 across a signal line 510 to N+ active region 500 for the drain of transistor Q1, Q2 and electrically connected by respective contacts C1, C2 to N+ active regions 500 for the drain of transistors Q1, Q2. Likewise, each pair of bit lines BLi, /BLi, BLj, /BLj is horizontally extended from the memory array part 90 across a signal line 810 to N+ active region 800 for the drain of transistor Q11, Q12 and electrically connected by respective contacts C11, C12 to N+ active regions 800 for the drain of transistors Q11, Q12.

Also, each pair of bit lines BLi, /BLi, BLi, /BLj is horizontally extended from the N+ active region 400 for the source of transistors Q4, Q5 across N+ active region 313, N+ active region 100 and P+ active region 200 in sequence to the N+ active region 700 for the source of transistor Q14, Q15. Also, each pair of bit lines BLi, /BLi, BLj /BLj is electrically connected by respective contacts C3, C4 to the source of transistors Q4, Q5 and by respective contacts C13, C14 to the source of transistors Q14, Q15.

In addition, each pair of bit lines is vertically extended across a part of the associated gates 120, 130 to the N+ active region 100 for the drain D of transistors Q6, Q7 and electrically connected by contacts C5, C6 to the drain D of transistors Q6, Q7. Each pair of bit lines also is electrically connected by contacts C7, C8 to gates 120, 130 at the external part of the N+ active region 100. Similarly, each pair of bit lines is vertically extended across a part of the relevant gates 220, 230 to the P+ active region 200 for the drain D of transistors Q16, Q17 and electrically connected by contacts C15, C16 to the drain D of transistors Q16, Q17. Each pair of bit lines also is electrically connected by contacts C17, C18 to gates 230, 220 at the external part of the P+ active region 200.

The power line 140 is vertically extended across pairs of bit lines BLi, /BLi, BLj, /BLj, which are electrically connected by a contact C19 to the N+ active region 100 for the source of transistors Q6, Q7. Similarly, the power line 240 is vertically extended across pairs of bit lines BLi, /BLi, BLj, /BLj, which are electrically connected by a contact C20 to the P+ active region 200 for the source of transistors Q16, Q17.

The input/output lines IO1, IO2 are spaced apart from right to left and vertically extend across the N+ active region 313. The input/output lines /IO1, /IO2 are spaced apart from right to left and vertically extend across the N+ active region 323. The input/output line IO1 is electrically connected by a contact C33 to the source S of transistor Q8 of a pair of bit lines BLi, /BLi, while the input/output line /IO1 is electrically connected by a contact C34 to the source S of transistor Q9 of the pair of bit lines BLj, /BLj. A line for supplying signal IOG to gates 350,360 is not illustrated.

As described above, embodiments of the present invention can reduce the size of the memory device and/or can reduce the number of contacts.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:

first and second memory cell array parts having a plurality of pairs of bit lines;

first and second sense amplifying parts arranged between the first and second memory cell array parts for detecting and amplifying a difference in voltage of each pair of bit lines of the first and second memory cell array parts;

first and second voltage equalizing parts respectively arranged between the first and second memory cell array parts and the first and second sense amplifying parts for equalizing voltage of each pair of bit lines of the first and second memory cell array parts;

first and second transmission parts respectively arranged between the first and second sense amplifying parts and the first and second voltage equalizing parts for selecting either the first or the second memory cell array part for transmitting the voltage of a pair of bit lines of a selected memory cell array part; and first and second input/output selection parts respectively arranged between the first and second amplifying parts and the first and second transmission parts for selectively outputting the voltage amplified at the first and second sense amplifying parts to input/output lines.

2. An integrated circuit memory device according to claim 1, wherein a source of transistors of the first transmission part and a drain of transistors of the first input/output selection part are in a common arrangement.

3. An integrated circuit memory device according to claim 1, wherein a source of transistors of the second transmission part and a drain of transistors of the second input/output selection part are in a common arrangement.

4. An integrated circuit memory device comprising:

first and second memory cell arrays;

first and second transmission parts between the first and second memory cell arrays;

first and second input/output selection parts between the first and second transmission parts; and at least one sense amplifier part between the first and second input/output selection parts.

5. An integrated circuit memory device according to claim 4 wherein the at least one sense amplifier part comprises first and second sense amplifier parts.

6. An integrated circuit memory device according to claim 4 wherein the first transmission part is adjacent the first input/output selection part and wherein the second transmission part is adjacent the second input/output selection part.

7. An integrated circuit memory device according to claim 6 wherein a transistor in the first transmission part and a transistor in the first input/output selection part share a first common source/drain region and a transistor in the second transmission part and a transistor in the second input/output selection part share a second common source/drain region.

8. An integrated circuit memory device according to claim 4 further comprising a first equalizing part between the first memory cell array and the first transmission part and a second equalizing part between the second memory cell array and the second transmission part.

9. An integrated circuit memory device according to claim 4 further comprising first input/output lines that are connected to the first input/output selection part and second input/output lines that are connected to the second input/output part.

10. An integrated circuit memory device comprising:

first and second memory cell arrays;

first and second transmission parts between the first and second memory cell arrays; and first and second input/output selection parts between the first and second memory cell arrays;

wherein the first transmission part is adjacent the first input/output selection part and remote from the second input/output selection part and wherein the second transmission part is adjacent the second input/output selection part and remote from the first input/output selection part.

11. An integrated circuit memory device according to claim 10 wherein the first and second input/output selection parts are between the first and second transmission parts.

12. An integrated circuit memory device according to claim 10 further comprising a first equalizing part between the first memory cell array and the first transmission part and a second equalizing part between the second memory cell array and the second transmission part.

13. An integrated circuit memory device comprising:

first and second memory cell arrays;

first and second transmission parts between the first and second memory cell arrays;

first and second input/output selection parts between the first and second memory cell arrays; and at least one sense amplifier part between the first and second input/output selection parts;

wherein the first transmission part is adjacent the first input/output selection part and wherein the second transmission part is adjacent the second input/output selection part.

14. An integrated circuit memory device according to claim 13 wherein the at least one sense amplifier part comprises first and second sense amplifier parts.

15. An integrated circuit memory device comprising:

first and second memory cell arrays;

first and second transmission parts between the first and second memory cell arrays; and first and second input/output selection parts between the first and second memory cell arrays;

wherein the first transmission part is adjacent the first input/output selection part and wherein the second transmission part is adjacent the second input/output selection part; and wherein a transistor in the first transmission part and a transistor in the first input/output selection part share a first common source/drain region and a transistor in the second transmission part and a transistor in the second input/output selection part share a second common source/drain region.

16. An integrated circuit memory device comprising:

first and second memory cell arrays;

first and second transmission parts between the first and second memory cell arrays;

first and second input/output selection parts between the first and second memory cell arrays; and first input/output lines that are connected to the first input/output selection part and second input/output lines that are connected to the second input/output part;

wherein the first transmission part is adjacent the first input/output selection part and wherein the second transmission part is adjacent the second input/output selection part.

* * * * *